(12) United States Patent
Tassart (10) Patent No.: US 8,823,559 B2
(45) Date of Patent: Sep. 2, 2014

(54) SHIFT-INVARIANT DIGITAL SAMPLING RATE CONVERSION SYSTEM

(75) Inventor: Stéphan Tassart, Paris (FR)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/881,581

(22) PCT Filed: Oct. 27, 2011

(86) PCT No.: PCT/EP2011/068882
§ 371 (c)(1),
(2), (4) Date: Jul. 9, 2013

(87) PCT Pub. No.: WO2012/055974
PCT Pub. Date: May 3, 2012

(65) Prior Publication Data
US 2013/0279562 A1    Oct. 24, 2013

Related U.S. Application Data

(60) Provisional application No. 61/448,356, filed on Mar. 2, 2011.

(30) Foreign Application Priority Data

Oct. 27, 2010 (EP) .................................. 10306182

(51) Int. Cl.
*H03M 7/00* (2006.01)
*H04L 1/00* (2006.01)
*H03H 17/06* (2006.01)
*H03H 17/04* (2006.01)

(52) U.S. Cl.
CPC ......... *H04L 1/0002* (2013.01); *H03H 17/0621* (2013.01); *H03H 17/0416* (2013.01); *H03H 17/0455* (2013.01); *H03H 17/0685* (2013.01)
USPC .................................. 341/61; 341/50; 341/51

(58) Field of Classification Search
CPC .................. H03H 17/0416; H03H 17/0455
USPC ................ 341/61, 50, 51; 375/219, 240, 355
See application file for complete search history.

(56) References Cited

U.S. PATENT DOCUMENTS 5,537,435 A * 7/1996 Carney et al. ................. 375/219
6,915,225 B2   7/2005 Jorgensen
(Continued)

FOREIGN PATENT DOCUMENTS

WO    2008077422 A1   7/2008
WO    2010047805 A2   4/2010

OTHER PUBLICATIONS

Dhuli, R., "Issues in the Implementation of General Dual-rate systems", 2009 Annual IEEE India Conference (INDICON), Dec. 18, 2009, pp. 1-4, XP 031625420, IEEE.

(Continued)

*Primary Examiner* — Jean B Jeanglaude
(74) *Attorney, Agent, or Firm* — Coats & Bennett, P.L.L.C.

(57) ABSTRACT

There is described a method of making a linear periodically time varying system shift-invariant, comprising the following steps implemented for each input signal the sampling rate of which has to be converted: —generating a set of polyphase components based on the input signal, —feeding the generated set of polyphase components to the system, and —generating an output signal by performing interleaving, shifting and addition on signals output by the system corresponding to the generated set of polyphase components processed by the system.

13 Claims, 7 Drawing Sheets

(56) References Cited

U.S. PATENT DOCUMENTS

| | | | | |
|---|---|---|---|---|
| 7,292,166 | B2* | 11/2007 | Asami | 341/118 |
| 7,583,771 | B2* | 9/2009 | Zweigle et al. | 375/355 |
| 2012/0127009 | A1* | 5/2012 | Pagnanelli | 341/143 |

OTHER PUBLICATIONS

Mehr, A. S., "Alias—Component Matrices of Multirate Systems", IEEE Transactions on Circuits and Systems II: Express Briefs, May 1, 2009, pp. 489-493, vol. 56, Issue 6, IEEE Circuits and Systems Society, USA.

Mehr, A. S. et al., "Representations of Linear Periodically Time-Varying and Miltirate Systems", IEEE Transactions on Signal Processing Journal, Sep. 1, 2009, pp. 2221-2229, vol. 50, Issue 9, IEEE Press Piscataway, NJ, USA.

Annonimous, "SRC Comparisons—Help and Information", in section "Test signal, Passband", [Retrieved on Apr. 11, 2013], Retrieved from Internet: http://src.infinitewave.ca/help.html.

Annonimous, "SRC Comparisons", [Retrieved on Apr. 11, 2013], Retrieved from Internet: http://src.infinitewave.ca/.

Farina, A., "Silence Sweep: a novel method for measuring electro-acoustical devices", Convention Paper 7700, Audio Engineering Society, 126th Convention, May 7, 2009, pp. 1-12, Munich, Germany.

Farina, A., "Simultaneous Measurement of Impulse Response and Distortion with a Swept-Sine Technique", Convention Paper, Audio Engineering Society, 108th Convention, Feb. 19, 2000, pp. 1-24, 5093 (D-4), Paris, France.

Cellini, V. et al., "On the Time Invariance of Linear Systems", 14th European Signal Processing Conference (EUSIPCO 2006), Florence, Italy, Sep. 4, 2006, pp. 1-5, EURASIP.

Gopinath, R.A. et al., "On Upsampling, Downsampling and Rational Sampling Rate Filter Banks", Draft to appear in IEEE Trans. in SP, CML TR 91-25, Nov. 25, 1991, pp. 1-38, Rice University, Houston, TX.

Heinle F. et al., "An Enhanced Method for Measuring the Performance of Multirate Systems", Conference publication, International Conference on Digital Signal Processing, Jun. 26, 1995, pp. 1-6, Limassol, Cyprus.

Heinle, F. et al., "Symbolic Analysis of Multirate Systems", Journal publication, MapleTech 3, No. 1, pp. 30-37, 1996, Boston : Birkhauser Publishing, USA.

Heinle F., et al., "Measuring the Performance of Implemented Multirate Systems", Conference publication, 1996 IEEE International Conference on Acoustics, Speech, and Signal Processing, Conference Proceedings, May 7, 1995, pp. 2754-2757, vol. 5, IEEE.

Meyer, R. A., "A Unified Analysis of Multirate and Periodically Time-Varying Digital Filters", IEEE Transactions on Circuits and Systems, Mar. 1, 1975, pp. 162-168, vol. 22, Issue 3, IEEE.

Reng, R., "Polyphase and Modulation Descriptions of Multirate Systems—A Systematic Approach", International Conference on Digital Signal Processing, Jun. 26, 1995, pp. 1-6, Limassol, Syprus.

Schuessler, H. et al., "Measurement and Symbolic Analysis of Implemented Multirate Systems", University of Erlangen-Nuremberg, Germany, [Retrieved on Apr. 19, 2013], Retrieved from internet: http://www.eurasip.org/Proceedings/Eusipco/1996/paper/ss_3_10.pdf.

Wu, S-C. et al., "Performance and Aliasing Analysis of Multi-rate Digital Controllers with Interlacing", Proceeding of the 2004 American Control Conference, Boston, Massachusetts, Jun. 30, 2004, pp. 3514-3519, vol. 4, IEEE.

Chen, T. et al., "Linear Periodically Time-Varying Discrete-Time Systems: Aliasing and LTI Approximations", Proceedings of the 35th IEEE Conference on Decision and Control, Dec. 11, 1996, pp. 2677-2682, vol. 3, IEEE.

Yin, W. et al., "Identification of linear periodically time-varying systems using periodic sequences", 18th IEEE International Conference on Control Applications Part of 2009 IEEE Multi-conference on Systems and Control, Saint Petersburg, Russia, Jul. 8, 2009, pp. 1455-1459, IEEE.

Reng, R. et al., "Measurement of Aliasing Distortions and Quantization Noise in Multirate Systems", Conference publication, 1992 IEEE International Symposium on Circuits and Systems, Proceedings, May 10, 1992, pp. 2328-2331, vol. 5, IEEE.

Vaidyanathanm, P. P., "Multirate Systems and Filter Banks", Jan. 1, 1993, pp. 100-103, 120-122, 188-195, Prentice Hall, USA.

* cited by examiner

SHIFT-INVARIANT DIGITAL SAMPLING RATE CONVERSION SYSTEM

TECHNICAL FIELD

The present invention generally relates to digital sampling rate conversion systems, and more specifically to devices and methods for making such systems shift-invariant and/or characterizing such systems.

BACKGROUND

Digital sampling rate conversion (SRC) systems receive sampled input signals at a given sampling rate and output the signal with a different sampling rate. The SRC system may increase (upsample) or decrease (downsample) the sampling rate of the signal.

The sampling rate conversion systems are widely used in audio or video systems for performing conversion of audio or video files from a given codec to another. SRC systems may have other applications.

Before integrating a sampling rate conversion system in a multimedia (e.g. audio and/or video) architecture, there may be the need of characterizing the SRC system for studying its behaviour.

Different approaches to characterization and performance measurements for multirate systems exist in the prior art.

SRC may be dealt with as a specific case of a multirate system (MRS). In some prior art approaches, fractional rate sampling rate convertors (SRC) are not considered as Linear Periodically Time Varying (LPTV) systems. For an SRC, input and output periods are constrained to be different. In other approaches, assuming an explicit definition of LPTV with potentially different input and output periods, SRC is clearly considered as LPTV. LPTV systems form a wider class than SRC since filter banks belong to LPTV.

LPTV systems may be entirely described in a polyphase context with tools including: analysis network (PPAN), synthesis network (PPSN) and polyphase matrix.

Typically, the following approach may be used in order to describe a LPTV system: Find a representation that embeds a Linear Time Invariant (LTI) system and characterize the LTI system with some suitable method.

Various different approaches are possible. For example, the LTI system may include a MIMO LTI system characterized by a bi-spectrum. Other approaches include a linear switched time varying (LSTV) system.

The characterizing bi-spectrum may be obtained through different means. For example via formal analysis by serial or parallel concatenation of basic building blocks (MIMO LTI system, decimator, expander, modulator), or via black box analysis with excitation of the system with a set of orthogonal test vectors.

Several techniques may be used for characterizing sampling rate conversion systems (SRC) from the outside (the SRC system being considered as a black box or a near black box (or grey) component).

The parameters characterizing the SRC system may be:
the in-band linear characteristics of the system,
the out-of-band characteristics of the system that generates spectrum aliases, and
the additional background noise due to rounding errors.

The characterizing methods may be based on a distortion measurement either on a sine wave or on a sine sweep wave. The characterization methods may also be based on the reconstruction of the impulse response of the SRC system.

However, SRC systems are not shift-invariant (or time-invariant) systems. For an SRC system, the output of a delayed sequence is not necessarily the delayed version of the resulting output of the non-delayed sequence. This lack of shift-invariance generates aliasing, which penalizes the characterization methods.

Therefore, whereas the aliasing behaviour is not due to a non-linear behaviour, aliasing of SRC systems is usually studied as if it was a non-linear distortion with methods and criterion such as total distortion methods.

In fact, for an SRC system, a source of non-linearity may be the rounding errors. Total distortion methods are thus unable to discriminate between aliasing and real non-linearity.

Hence, there is a need for facilitating the characterization of the SRC systems.

SUMMARY

Therefore, a first aspect of the invention relates to a method for making SRC systems shift-invariant (or time-invariant).

It is noted that embodiments of the invention may be equally applicable to any LPTV system (e.g. when P and R are not coprime), even though described below in the context to SRC systems only.

According to the first aspect, there is provided a method of converting the sampling rate of an input signal with input/output shift-invariance using a Linear Periodically Time Varying, LPTV, system.

The method comprises generating a set of polyphase components of the input signal.

The LPTV system being a digital Sampling Rate Conversion, SRC, system and having a fractional ratio $$\frac{R}{P},$$

with R and P being co-primes, the method further comprises selecting three integer numbers Q, M and q that satisfy the following equations:

M=RQ, q=PQ, and

MP=qR, and the generation of each polyphase component of the set of polyphase components comprises
time shifting the input signal a number of times comprised between 0 and MP; and,
M-fold decimating the time shifted input signals
The method further comprises:
feeding the generated set of polyphase components to the SRC system; and,
generating an output signal corresponding to the input signal with converted sampling rate, by performing interleaving, shifting and addition on signals output by the SRC system corresponding to the generated set of polyphase components processed by said SRC system.

Once the SRC system is made shift-invariant (or time-invariant) LTI (Linear Time Invariant) characterization methods can be applied and true non-linearity of the SRC system can be studied separately.

A second aspect of the invention relates to a method of characterizing a Linear Periodically Time Varying, LPTV, system being a Sampling Rate Conversion, SRC, system. The method comprises:

inputting at least one input signal being one of the group consisting of: an impulse and a test sequence;

implementing a method according to the first aspect with the input signal; and, characterizing the SRC system through the output signal.

In a variant, the second aspect relates to a method of characterizing a Linear Periodically Time Varying, LPTV, system comprising:

inputting at least one input signal being one of the group consisting of: a sine-sweep signal, a sine signal, multiple sine signals, a multi-sine signal, multiple multi-sine signals, a maximum length sequence, or an all pass filtered impulse signal;

implementing a method according to the first aspect, with the input signal; and, characterizing the LPTV system through the output signal.

Embodiments of the invention are recited in the dependent claims attached hereto.

For example, the method may be performed in real time. In such an embodiment, different instantiations of the SRC system may be used for generating in parallel the polyphase components.

In other embodiments, the polyphase components may be generated by a same instantiation of the SRC system.

The output signal may be generated by an overlapping-add operation.

Once the method implemented, SRC systems behave as linear and shift invariant (LSI) systems. Hence, the SRC systems may be modelled as discrete filters operating in the oversampling domain.

According to some embodiments, the alias components are pushed out of the bandwidth of the SRC system, which facilitates the characterization of the SRC system.

Thus, methods for characterizing shift-invariant systems can be applied in the oversampled domain.

For example, the impulse response characterization method or the transfer function characterization method may be used.

Once the SRC system is made shift-invariant, any remaining distortion or background noise in the SRC system may be associated to internal rounding errors caused by the arithmetic of the SRC system.

Therefore, any distortion method identifying these non-linearities can be used in the oversampled domain for characterizing those rounding errors, and then the SRC system.

For example, the Harmonic distortion method, or the Exponential Sine-Sweep may be used.

A third aspect of the present invention relates to a computer program product comprising one or more stored sequences of instructions that are accessible to a processor and which, when executed by the processor, cause the processor to carry out the steps of the method of the first and/or the second aspect of the present invention.

A fourth aspect of the present invention relates to a system for converting the sampling rate of an input signal with input/output shift-invariance comprising:

a Linear Periodically Time Varying, LPTV, system being a Sampling Rate Conversion, SRC system having a fractional ratio $$\frac{R}{P},$$

with R and P being co-primes;

a first input port adapted to receive the input signal;

a first output port adapted to output polyphase components of the input signal to the SRC system, a second input port adapted to receive signals outputted by the SRC system corresponding to the polyphase components processed by said SRC system, a processing unit being adapted to generate the polyphase components and to select three integer numbers Q, M and q that satisfy the following equations:

$$M=RQ,$$

$$q=PQ, \text{ and}$$

$$MP=qR,$$

said processing unit comprising:

a time shifting unit adapted to time shift the input signal a number of times comprised between 0 and MP, and an M-fold decimator adapted to decimate the time shifted input signals. and being further adapted to perform interleaving, shifting and addition on the signals outputted by the SRC system for generating an output signal, and a second output port adapted to output the generated output signal.

A fifth aspect of the present invention relates to a system configured to characterize a sampling rate conversion system comprising:

a system according to the fourth aspect, and a characterization unit adapted to perform a method according to the second aspect.

BRIEF DESCRIPTION OF THE DRAWINGS

The present invention is illustrated by way of example, and not by way of limitation, in the figures of the accompanying drawings, in which like reference numerals refer to similar elements and in which.

DESCRIPTION OF EMBODIMENTS

In the following, we consider a digital sampling rate conversion (SRC) system having a fractional ratio R/P (R and P being co-primes).

Figure 1:
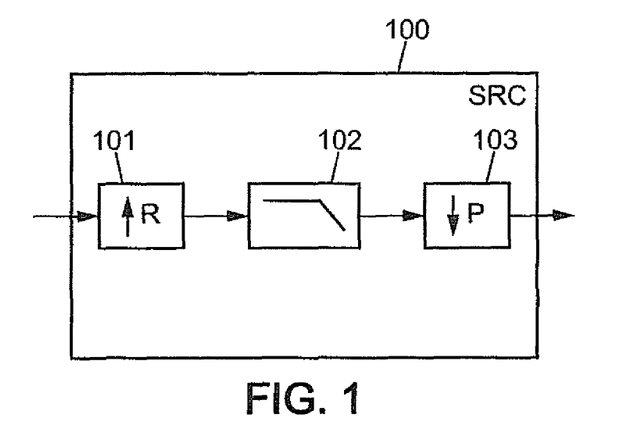
FIG. 1 is a schematic illustration of an SRC system.

An SRC system 100 may be represented as the association of an R-fold expander 101, followed by a low-pass filter 102, and followed by a P-fold decimator 103, as illustrated in FIG. 1.

In some embodiments the system 100 may be seen as a canonical representation for a resampler, 101 combined with 102 as an integer rate upsampler and 102 combined with 103 as an integer rate downsampler.

This representation always exists and is unique. Therefore, it is a canonical representation. The canonical representation of an SRC may be different from the actual implementation. In implementations that include multistage operations with possible interpolation algorithms, the canonical representation of the SRC system may be either unknown or difficult to retrieve.

The parameters characterizing the SRC algorithms used in SRC systems may be defined by the properties of the low pass filter H(z) as it will be apparent to the person with ordinary skill in the art.

Thus, the SRC system may be characterized, for example, by determining the z-transform of the impulse response H(z) of the low-pass filter, or its transfer function $$H(e^{i\pi \frac{v}{R}}),$$

v designating the reduced pulsation, and R the expansion ratio from the SRC system.

Figure 2A:
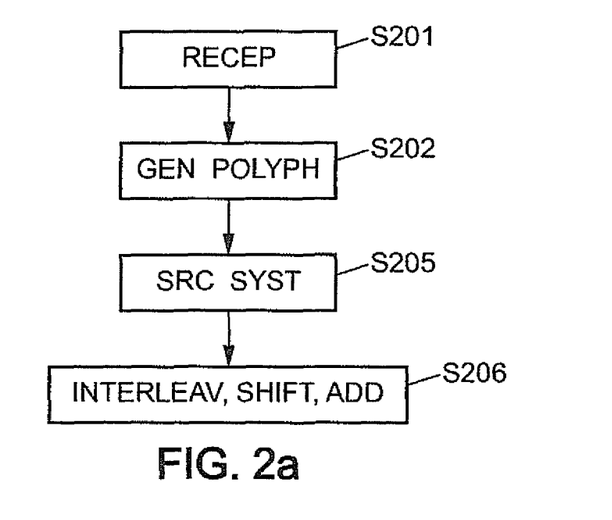
FIGS. 2a, 2b, 2c are flowcharts illustrating steps of methods according to embodiments of the invention.

According to some embodiments, as illustrated by FIG. 2a, an input discretized signal, the sampling rate of which is to be converted by the SRC system, is received in a first step S201. Then, during step S202, a set of polyphase components (as further described hereafter) is generated, based on the input signal.

Figure 2B:
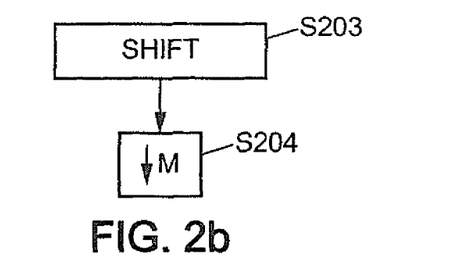

For example, as illustrated by FIG. 2b, step S202 may comprise a step S203 of time shifting the input signal k times, with k being an integer inclusively comprised between 0 and MP−1 (M verifying M=RQ, q=PQ, and MP=qR, q and Q being integer numbers, R and P being co-prime integers), and the step S204 of M-fold decimating the time shifted signals.

After step S202, a step S205 of feeding the SRC system with the polyphase components is performed.

The polyphase components may be fed to a same instantiation of the SRC system. However, for example for real time applications, wherein the output samples of the different instantiations of the SRC systems produced at the same time are grouped within one frame, the SRC system may be instantiated a number of times equal to the number of polyphase components. Then, the processing of the polyphase components by the instantiations of the SRC system may be performed at the same time (in parallel). Other variants of the number of instantiations and feeding of polyphase components may also be applicable.

Then, after step S205, a step S206 of generating an output signal is performed. The output signal is generated based on the output of the SRC system (or the outputs of the different instantiations of the SRC system). The output signal is generated by interleaving, shifting and adding the signals output by the SRC system (or the outputs of the different instantiations of the SRC system). The output signal may also be generated by an overlapping add operation on the outputs of the SRC system (for example in case of a real time application).

Figure 2C:
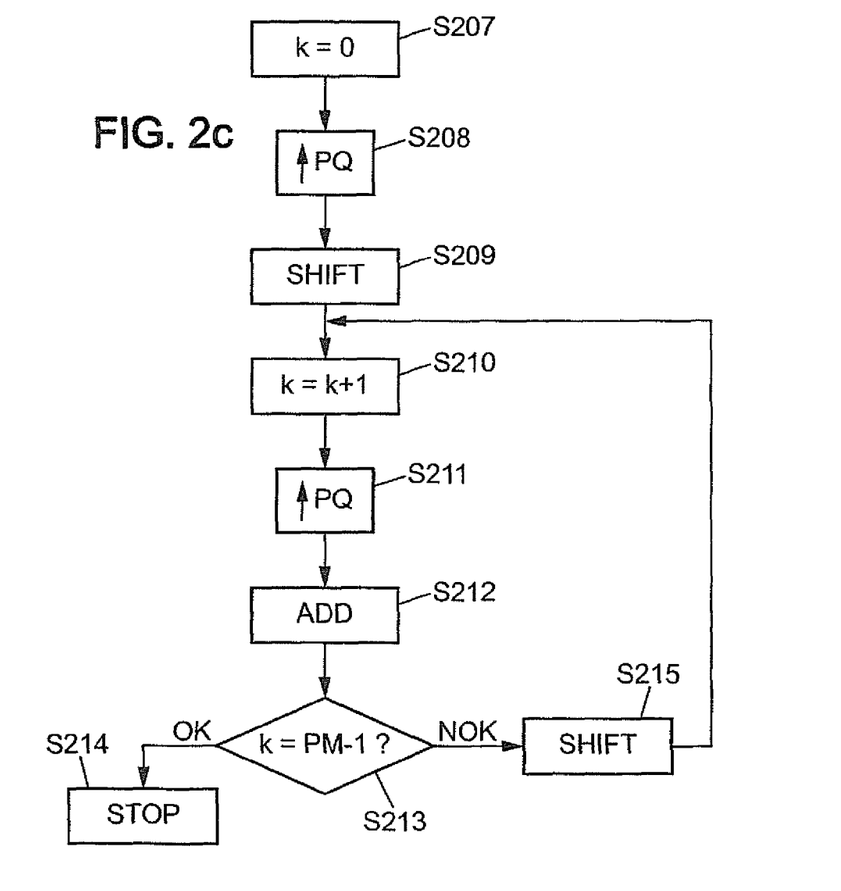

For example, as illustrated by FIG. 2c, step S206 may comprise initializing the generation of the output signal S207, by receiving the signal output by the SRC corresponding to the polyphase component which has not been time shifted (corresponding to k=0). Then, in step S208, the received signal is expanded at a rate of PQ, and the expanded signal is then time shifted in step S209. Then, the process continues with step S210 by receiving the output signal of the SRC system that has been time shifted k+1 times. This output signal is expanded at a rate of PQ during step S211, and the resulting signal is added, in step S212, to a previous addition of the processed signals (corresponding to the polyphase components time shifted a number of times 0, 1, . . . , k). Then in step S213, it is verified whether all the output signals from the SRC system have been processed. If MP−1 output signal have been processed, then the generation of the output signal is terminated in step S214 and the output signal corresponds to the sum calculated in the last iteration of step S211. In the other case, the sum calculated in the last iteration of step S212 is time shifted in step S215 and the process goes back to step S210.

Figure 3A:
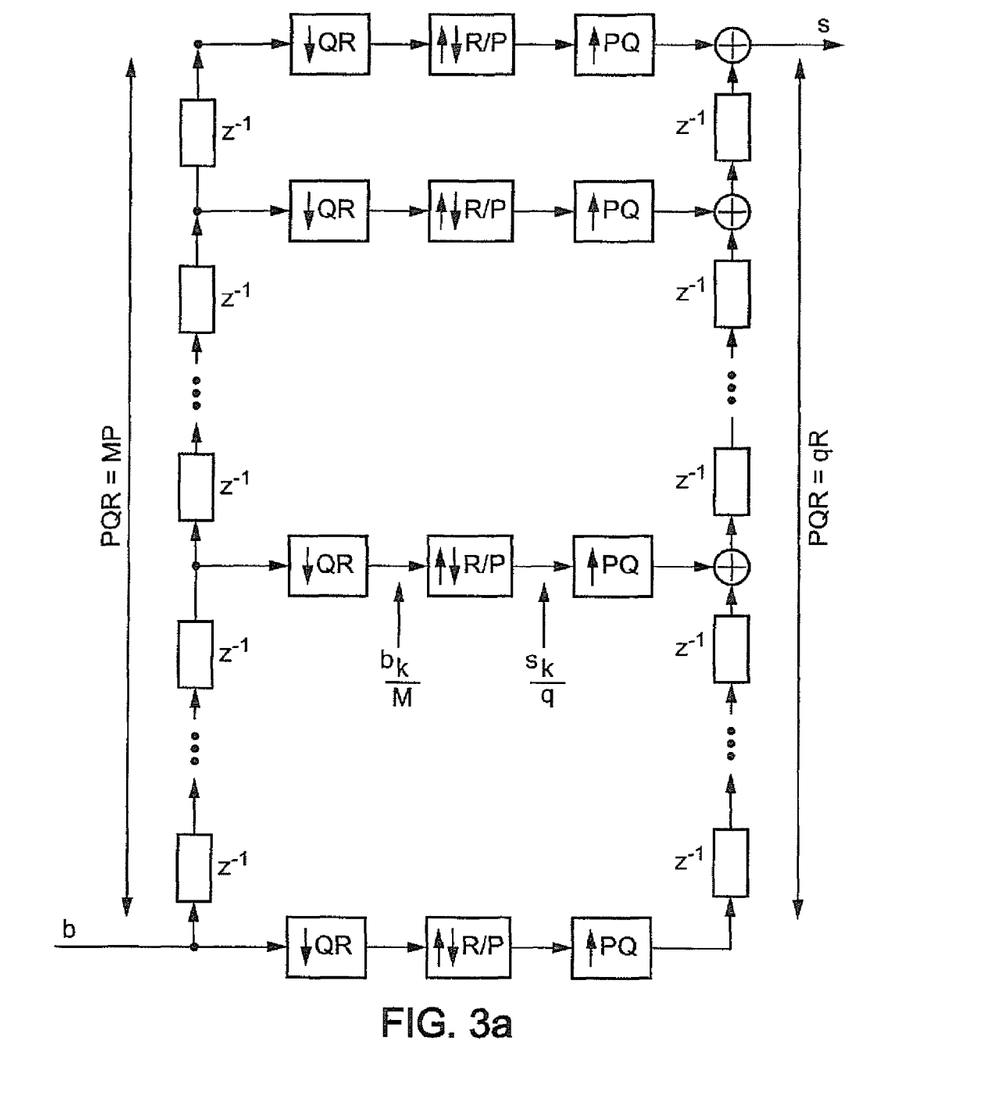
FIGS. 3a and 3b are a schematic illustrations of multi-rate frameworks according to embodiments of the invention.
Figure 3B:
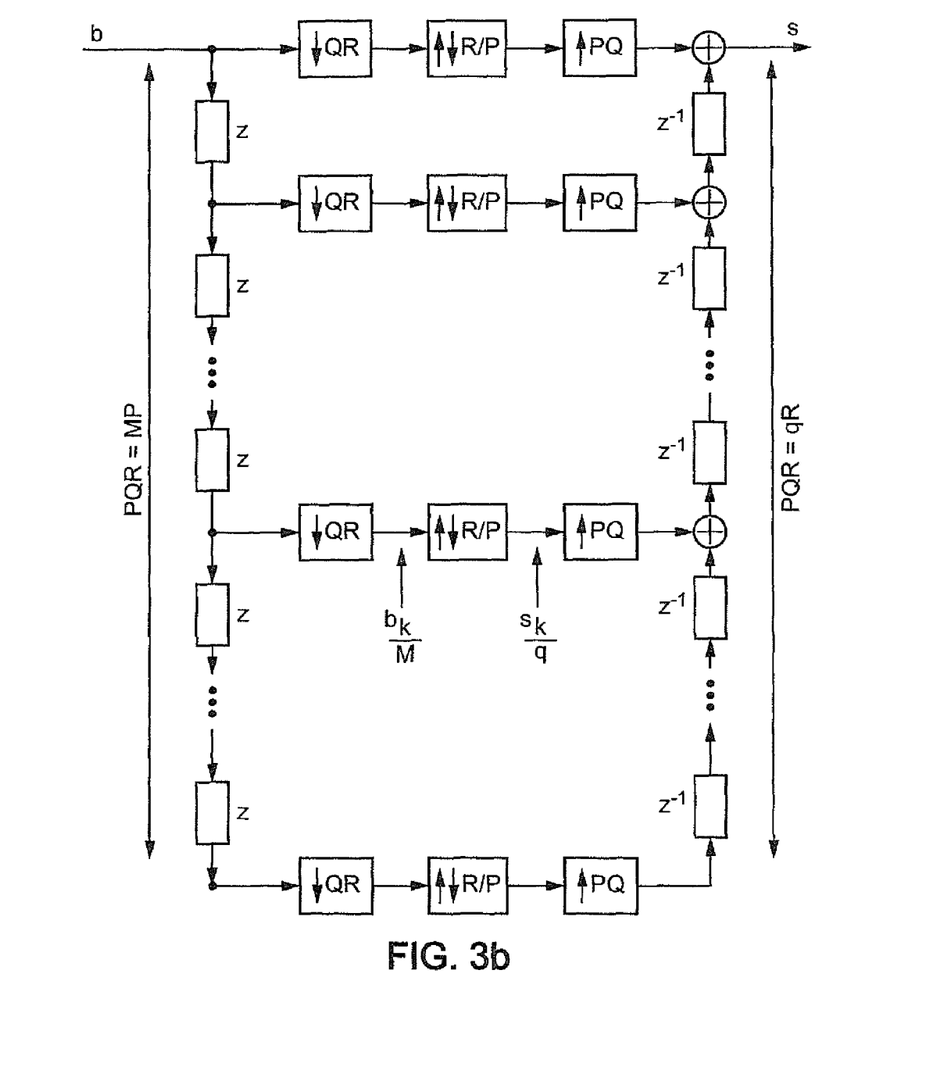

The above described embodiment is also illustrated by the multi-rate frameworks of FIGS. 3a and 3b.

FIG. 3a shows a number PQR of parallel processing lines each comprising a QR-fold decimator, the SRC system with a rate of R/P and a PQ-fold expander. The input signal is fed to a first processing line and to a delay $z^{-1}$ that outputs the delayed signal to another processing line and to another delay, and so on until the last processing line receives the input signal delayed PQR times. The first processing line outputs a signal to a delay $z^{-1}$ that feds the delayed signal to an adder that sums the delayed signal and the output of the second processing line and so on. The combination of the delays and the adders performs the operation of overlap add.

FIG. 3b shows an alternative framework using anti-causal advances z. In this framework, the input signal b is fed to the last processing line and the delays $z^{-1}$ of the left side of the framework are replaced by advances z.

Figure 4:
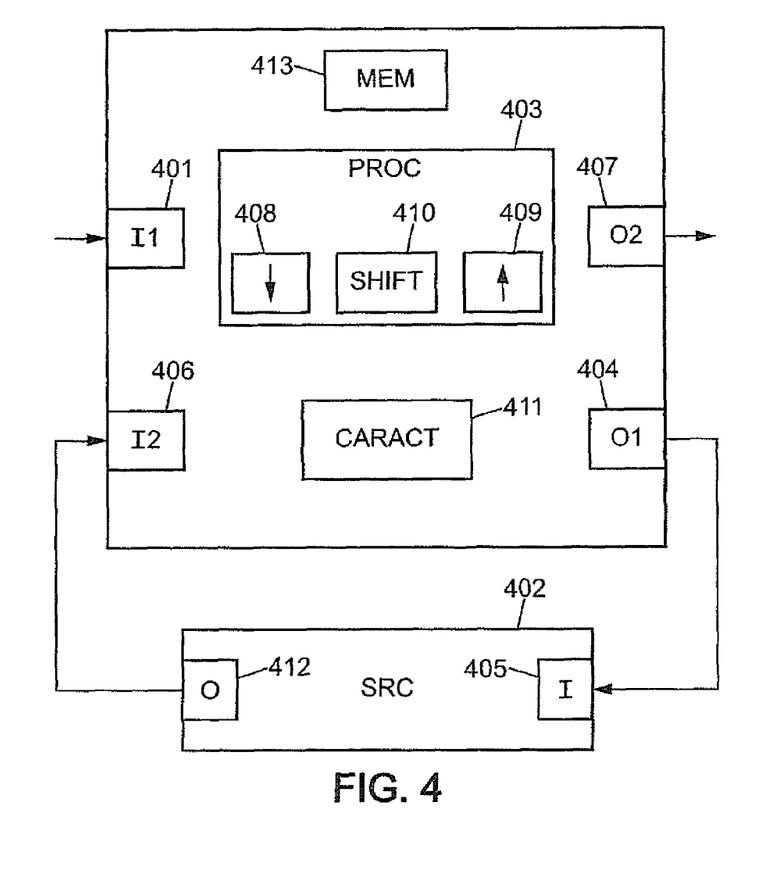
FIG. 4 is a schematic illustration of a system according to embodiments of the invention.

A system according to some embodiments is illustrated by FIG. 4.

The system comprises an input port 401 for receiving a signal at a rate M times the operating input rate of the SRC system 402. The input port 401 may also receive a signal used for characterizing the SRC system 402.

The system further comprises a processing unit 403 for generating the polyphase components. These polyphase components may be fed to the SRC system 403 through an output port 404 that may be coupled to an input port 405 of the SRC system.

The system further comprises an input port 406 for receiving signals output by the SRC system through its output port 412 corresponding to the processed polyphase components. These processed polyphase components may be used by the processing unit 403 for generating and outputting the output signal through an output port 407.

The output port 407 receives a signal at a rate q time the operating output rate of the SRC system. The feeding rate of 401 is identical to the filling rate of 407.

The processing unit may comprise a decimator 408, an expander 409, and a time shifting unit 410.

According to some embodiments, the system may comprise a characterization unit 411 for characterizing the SRC system.

Also, the system according to embodiments may comprise a memory unit 413 for storing data for the implementation of a method according to embodiments of the invention, or storing a computer program according to embodiments of the invention.

In the following, the method for making the SRC system shift-invariant is further explicated.

Making the SRC System Shift-Invariant

In the following, it is shown how a set of system responses organized as a sum of interleaved and shifted signal is linear and time-invariant when this set forms a set of regularly delayed signals from 0 to MP−1 samples.

Under those conditions, the z-transforms S(z) of the interleave-shift-added (ISA) system responses follow an expression which allows a characterization of the SRC system for both in-band and out-of-band domains (B(z) being the z-transform from an interleaved test sequence):

$$S(z)=H(z^Q) \times B(z).$$

EXAMPLE 1

Upsampler

Let's consider the problem of characterizing an upsampler with a rate of R=3. The upsampler may be characterized by its canonical representation through a low pass filter H(z). The R-polyphase decomposition $(h_l(z^R))_{l \in [0,R)}$ of H(z) is given as:

$$H(z) = \sum_{l=0}^{R-1} z^{-l} h_l(z^R).$$

For the sake of readability, in the following, a sequence $(s_n)_{n \in N}$ may be assimilated to its z-transform S(z).

Now, we consider a set of test vectors $$b_{\frac{k}{M}}(z),$$

for instance slightly delayed versions of a band-limited unit impulse or, said differently, an approximation of the shifted unit $$z^{\frac{k}{M}}$$

(this being only a notation for a sequence describing a fractional delay of the shifted unit impulse, here $$(z^M)^{\frac{k}{M}}$$

does not equal $z^k$).

The individual vectors $$b_{\frac{k}{M}}(z)$$

are obtained as the M-polyphase decomposition of B(z):

$$B(z) = \sum_{k=0}^{M-1} z^{-k} b_{\frac{k}{M}}(z^M) \qquad (1)$$

For the matter of this example, consider M=24, which is not too large but still shares a common denominator with most usual resampling ratios (apart ratios translating sampling rates from the 44.1 kHz domain to sampling rates simple multiple of 8 kHz).

Let's start with the processing (i.e. here, the up-sampling) of each test vectors $$b_{\frac{k}{M}}(z),$$

resulting into the vectors $$s_{\frac{kR}{M}}(z).$$

The label kR/M is chosen in order to remind that if everything was ideal, $$s_{\frac{kR}{M}}(z)$$

would match the fractional delay $$z^{\frac{kR}{M}}.$$

$$s_{\frac{kR}{M}}(z) = \sum_{l=0}^{R-1} z^{-l} h_l(z^R) b_{\frac{k}{M}}(z^R) = H(z) \cdot b_{\frac{k}{M}}(z^R)$$

In this case, we have M/R=Q=8 and therefore the 8 first processed vectors form a polyphase decomposition of the unit impulse: $s_{0/8}(z), s_{1/8}(z), \ldots, s_{7/8}(z)$. Therefore, let's consider $S_0(z)$ obtained as the result of interleaving those 8 vectors:

$$S_0(z) = \sum_{k=0}^{7} z^{-k} s_{\frac{kR}{M}}(z^8)$$

$$= \sum_{k=0}^{7} z^{-k} H(z^8) \cdot b_{\frac{k}{M}}(z^{8R})$$

$$= H(z^8) \times \left( \sum_{k=0}^{7} z^{-k} b_{\frac{k}{M}}(z^{8R}) \right).$$

Now, $S_0(z)$ is separable; define $\beta_l(z)$ as the second term of this product:

$$\beta_l(z) = \sum_{k=0}^{Q-1} z^{-k} b_{\frac{8l+k}{M}}(z^M).$$

Then, we have:

$$S_0(z) = H(z^Q) \times \beta_0(z) \qquad (2)$$

One may note that the 8 following processed vectors form another polyphase decomposition of the unit impulse: $s_{8/8}(z), s_{9/8}(z), \ldots, s_{15/8}(z)$. We can consider $S_1(z)$ obtained as the result of interleaving those 8 one-sample shifted vectors, i.e. $(z^{-1} s_{k/8}(z))_{k \in [8,16)}$:

$$S_1(z) = \sum_{k=0}^{7} z^{-k} z^{-8} s_{\frac{(k+M)R}{M}}(z^8)$$

$$= \sum_{k=8}^{15} z^{-k} s_{\frac{kR}{M}}(z^8)$$

$$= H(z^Q) \times \beta_1(z).$$

Note also that the 8 last processed vectors form again another decomposition of the unit impulse: $s_{16/8}(z)$, $s_{17/8}(z), \ldots, s_{23/8}(z)$. $S_2(z)$ is obtained as the result of interleaving those 8 two-sample shifted vectors, i.e. $(z^{-2} s_{k/8}(z))_{k \in [16,24]}$:

$$S_2(z) = \sum_{k=0}^{7} z^{-k} z^{-16} s_{\frac{(k+2M)R}{M}}(z^8)$$

$$= \sum_{k=16}^{23} z^{-k} s_{\frac{kR}{M}}(z^8)$$

$$= H(z^Q) \times \beta_2(z)$$

Finally we have $S(z)$, the z-transform from the sequence obtained as the addition from the three previous sequences:

$$S(z) = \sum_{l=0}^{2} S_l(z) = H(z^Q) \sum_{l=0}^{R-1} \beta_l(z)$$

We can recognize in $\Sigma_{l=0}^{R-1} \beta_l(z)$ the z-transform $B(z)$ (cf. Equation 1). Therefore, we have generated a sequence as the interleave-shift-add (ISA) operation from the processed test vectors $$s_{\frac{kR}{M}}(z),$$

which z-transform, $S(z)$, is not only separable from $H(z)$, but can also be divided by $B(z)$ (i.e. the z-transform from the interleaved test sequences):

$$S(z) = H(z^Q) \times B(z) \quad (3)$$

EXAMPLE 2

Downsampler

We consider the case of a simple downsampler of rate $1/P$. Test vectors $$b_{\frac{k}{M}}(z)$$

are obtained as the M-polyphase decomposition of $B(z)$ (cf. example 1, with for instance M=24):

$$B(z) = \sum_{k=0}^{M-1} z^{-k} b_{\frac{k}{M}}(z^M)$$

Consider also the continuation of the test vectors $$b_{\frac{k}{M}}(z)$$

for $k \geq M$:

$$\forall k \in [0, M), \forall l \in \mathbb{Z}, b_{\frac{k+lM}{M}}(z^M) = z^l b_{\frac{k}{M}}(z^M)$$

The down-sampling of any test vector $$b_{\frac{k}{M}}(z)$$

results into the vector $$s_{\frac{k}{MP}}(z):$$

$$s_{\frac{k}{MP}}(z^P) = \frac{1}{P} \sum_{m=0}^{P-1} H(\omega_P^m z) b_{\frac{k}{M}}(\omega_P^m z)$$

with $\omega_P$ being a non-obvious root from $X^P - 1$.

Now, consider the z-transform $S(z)$ of the sequence obtained by interleaving MP consecutive sequences derived from $$s_{\frac{k}{MP}}(z),$$

for instance starting from k=0:

$$S(z) = \sum_{k=0}^{MP-1} z^{-k} s_{\frac{k}{MP}}(z^{MP})$$

$$= \frac{1}{P} \sum_{k=0}^{MP-1} z^{-k} \sum_{m=0}^{P-1} H(\omega_P^m z^M) b_{\frac{k}{M}}(\omega_P^m z^M)$$

$$= \frac{1}{P} \sum_{m=0}^{P-1} H(\omega_P^m z^M) \sum_{k=0}^{MP-1} z^{-k} b_{\frac{k}{M}}(\omega_P^m z^M)$$

Consider the second part from this expression:

$$\sum_{k=0}^{MP-1} z^{-k} b_{\frac{k}{M}}(\omega_P^m z^M) = \sum_{k=0}^{M-1} \sum_{l=0}^{P-1} z^{-(k+lM)} b_{\frac{k+lM}{M}}(\omega_P^m z^M)$$

$$= \sum_{k=0}^{M-1} \sum_{l=0}^{P-1} z^{-(k+lM)} \omega_P^{lm} z^{lM} b_{\frac{k}{M}}(\omega_P^m z^M)$$

-continued $$= \sum_{k=0}^{M-1} \sum_{l=0}^{P-1} z^{-k} \omega_P^{lm} b_{\frac{k}{M}}(\omega_P^m z^M)$$

$$= \sum_{k=0}^{M-1} z^{-k} b_{\frac{k}{M}}(\omega_P^m z^M) \times \sum_{l=0}^{P-1} \omega_P^{lm}$$

Note that $X^P - 1 = (X-1)\Sigma_{l=0}^{P-1} X^l$. Therefore, if $\omega_P^m \neq 1$, then $\Sigma_{l=0}^{P-1} \omega_P^{lm} = 0$. Said differently and using the Kronecker symbol $$\sum_{l=0}^{P-1} \omega_P^{lm} = P \sum_r \delta_{m-rP}$$

Now, let's return to the original evaluation:

$$S(z) = \sum_{m=0}^{P-1} H(\omega_P^m z^M) \sum_{k=0}^{M-1} z^{-k} b_{\frac{k}{M}}(\omega_P^m z^M) \sum_r \delta_{m-rP}$$

$$= H(z^M) \sum_{k=0}^{M-1} z^{-k} b_{\frac{k}{M}}(z^M)$$

$$= H(z^M) B(z)$$

This concludes the evaluation of S(z) in the simple downsampling case:

$$S(z) = H(z^M) \times B(z) \quad (4)$$

This equation is similar to Eq. (3). This proves once again that $H(e^{j\pi v})$ can be estimated and that both in-band and out-of-band characteristics can be safely recovered.

General Case

We consider the characterization of a resampler with a fractional ratio R/P, R and P being co-primes. Following the upsampler example, we assume that this resampler is characterized by the unknown filter H(z) in its canonical representation.

An integer M is selected so that Q=M/R is an integer number. An integer q is defined as q=MP/R. The following relationships recap the properties between P, R, M and q:

$$M = RQ, \quad q = PQ, \quad MP = qR.$$

Finally, we consider the set of test vectors $$b_{\frac{k}{M}}(z)$$

obtained as the M-polyphase decomposition of B(z) (cf. example 1):

$$\forall k \in \mathbb{Z},$$

$$b_{\frac{k}{M}}(z^M) = \frac{z^k}{M} \sum_{n=0}^{M-1} \omega_M^{nk} B(\omega_M^n z).$$

Define also the composite root $\Omega_{m,n}$ as:

$$\forall m \in [0, P), \forall n \in [0, M), \Omega_{m,n} = \omega_q^m \omega_M^n$$

$$= \omega_{PQR}^{mR+nP}.$$

For further calculus, define also $\beta_l^m(z)$ (cf. the upsampler example) and $B_m(z)$ as:

$$\forall l \in [0, P),$$

$$\beta_l^m(z) = \sum_{k=0}^{Q-1} z^{-k} b_{\frac{k+lQ}{M}}(\omega_P^{Rm} z^M)$$

$$\forall m \in [0, P),$$

$$B_m(z) = \frac{1}{P} \sum_{l=0}^{PR-1} z^{-lQ} \beta_l^m(z) = \frac{1}{P} \sum_{l=0}^{PR-1} \sum_{k=0}^{Q-1} z^{-(k+lQ)} b_{\frac{k+lQ}{M}}(\omega_P^{Rm} z^M).$$

k+lQ with k in $\in[0,Q)$ and l in $\in[0, PR)$ covers the entire range [0, qR). Therefore, the previous sum can be rewritten as:

$$\forall m \in [0, P),$$

$$B_m(z) = \frac{1}{P} \sum_{k=0}^{qR-1} z^{-k} b_{\frac{k}{M}}(\omega_P^{Rm} z^M)$$

For the second evaluation, we have $\omega_{MP}^{Rm} = \omega_{Rq}^{Rm} = \omega_q^m$ and therefore:

$$b_{\frac{k+lQ}{M}}(\omega_P^{Rm} z^M) = b_{\frac{k+lQ}{M}}((\omega_q^m z)^M)$$

$$= \frac{(\omega_q^m z)^{k+lQ}}{M} \sum_{n=0}^{M-1} \omega_M^{n(k+lQ)} B(\omega_q^m \omega_M^n z)$$

$$= \frac{z^{k+lQ}}{M} \sum_{n=0}^{M-1} \Omega_{m,n}^{k+lQ} B(\Omega_{m,n} z)$$

Now, let evaluate $\beta_l^m(z)$ and finally $B_m(z)$:

$$\beta_l^m(z) = \sum_{k=0}^{Q-1} z^{-k} b_{\frac{k+lQ}{M}}(\omega_P^{Rm} z^M)$$

$$= \frac{z^{lQ}}{M} \sum_{k=0}^{Q-1} \sum_{n=0}^{M-1} \Omega_{m,n}^{k+lQ} B(\Omega_{m,n} z)$$

$$B_m(z) = \frac{1}{P} \sum_{l=0}^{PR-1} z^{-lQ} \beta_l^m(z)$$

$$= \frac{1}{MP} \sum_{l=0}^{PR-1} \sum_{k=0}^{Q-1} \sum_{n=0}^{M-1} \Omega_{m,n}^{k+lQ} B(\Omega_{m,n} z)$$

$$= \frac{1}{PQR} \sum_{k=0}^{PQR-1} \sum_{n=0}^{M-1} \Omega_{m,n}^{k} B(\Omega_{m,n} z)$$

The esampling of any test vector r $$b_{\frac{k}{M}}(z)$$

by the fractional ratio R/P results into the vector $$s_{\frac{kR}{MP}}(z) = s_{\frac{k}{q}}(z)$$

(cf. Appendix).

$$s_{\frac{k}{q}}(z^P) = \frac{1}{P}\sum_{m=0}^{P-1} H(\omega_P^m z) \cdot b_{\frac{k}{M}}(\omega_P^{Rm} z^R)$$

Consider the ISA sequence, S(z), derived from qR consecutive sequences $$s_{\frac{k}{q}}(z),$$

e.g. with k in [0, qR]. This ISA sequence results from the sum of R shifted interleaved sequences, $z^{-lq}S_l(z)$. Each of those sequences, $S_l(z)$, is the result from interleaving q consecutive sequences $$s_{\frac{k}{q}}(z),$$

e.g. for k in [lq, (l+1)q] (cf. the upsampler example for another slightly different—but equivalent—practical description for the ISA procedure). This process is described in FIG. 3b.

$$S(z) = \sum_{l=0}^{R-1} z^{-lq} S_l(z)$$

$$= \sum_{l=0}^{R-1} z^{-lq} \sum_{k=0}^{q-1} z^{-k} s_{\frac{k+lq}{q}}(z^q)$$

$$= \sum_{l=0}^{R-1} \sum_{k=0}^{q-1} z^{-(k+lq)} s_{\frac{k+lq}{q}}(z^{PQ})$$

$$= \sum_{k=0}^{qR-1} z^{-k} s_{\frac{k}{q}}(z^q)$$

$$= \sum_{k=0}^{qR-1} z^{-k} s_{\frac{k}{q}}(z^{PQ})$$

$$= \frac{1}{P}\sum_{k=0}^{qR-1} z^{-k} \sum_{m=0}^{P-1} H(\omega_P^m z^Q) \cdot b_{\frac{k}{M}}(\omega_P^{Rm} z^M)$$

-continued $$= \frac{1}{P}\sum_{m=0}^{P-1} H(\omega_P^m z^Q) \sum_{k=0}^{qR-1} z^{-k} b_{\frac{k}{M}}(\omega_P^{Rm} z^M)$$

$$= \sum_{m=0}^{P-1} H(\omega_P^m z^Q) B_m(z)$$

Let evaluate this expression in term of $B(\Omega_{m,n} z)$:

$$S(z) = \frac{1}{PQR}\sum_{m=0}^{P-1}\sum_{k=0}^{qR-1}\sum_{n=0}^{M-1} H(\omega_P^m z^Q) \Omega_{m,n}^k B(\Omega_{m,n} z)$$

Since P and R are co-primes, mR+nP mod(PQR) covers exactly the range [0, PQR) when m is in [0, P) and n in [0,RQ). Therefore, the double sum in m and n can be replaced by a simple sum in i, with m=i×R̄, R̄ being the multiplicative inverse from R in the ring $\mathbb{Z}/P\mathbb{Z}$:

$$S(z) = \frac{1}{PQR}\sum_{i=0}^{PQR-1}\sum_{k=0}^{qR-1} H(\omega_P^{i\bar{R}} z^Q) \omega_{PQR}^{ik} B(\omega_{PQR}^i z)$$

$$= \frac{1}{PQR}\sum_{i=0}^{PQR-1}\sum_{k=0}^{PQR-1} \omega_{PQR}^{ik} H(\omega_{PQR}^{iQ} z^Q) B(\omega_{PQR}^i z)$$

Since $\omega_{PQR}$ is a root of the unity, we have:

$$\sum_{k=0}^{PQR-1} \omega_{PQR}^{ik} = PQR \sum_r \delta_{i-rPQR}$$

This concludes the evaluation of S(z) and generalizes both Eq. (4) and Eq. (3):

$$S(z) = H(z^Q) \times B(z) \quad (5)$$

The transfer function $$H(e^{j\frac{\pi v}{R}})$$

from the resampler of ratio R/P can be estimated and both in-band and out-of-band characteristics can be recovered.

Figure 7:
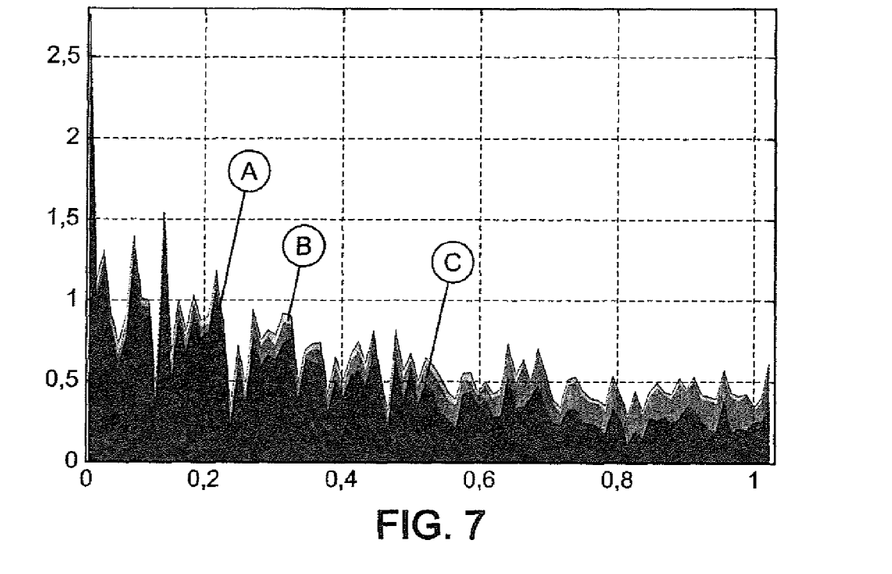
FIGS. 7 and 8 illustrate the un-aliasing effect of embodiments of the invention.
Figure 8:
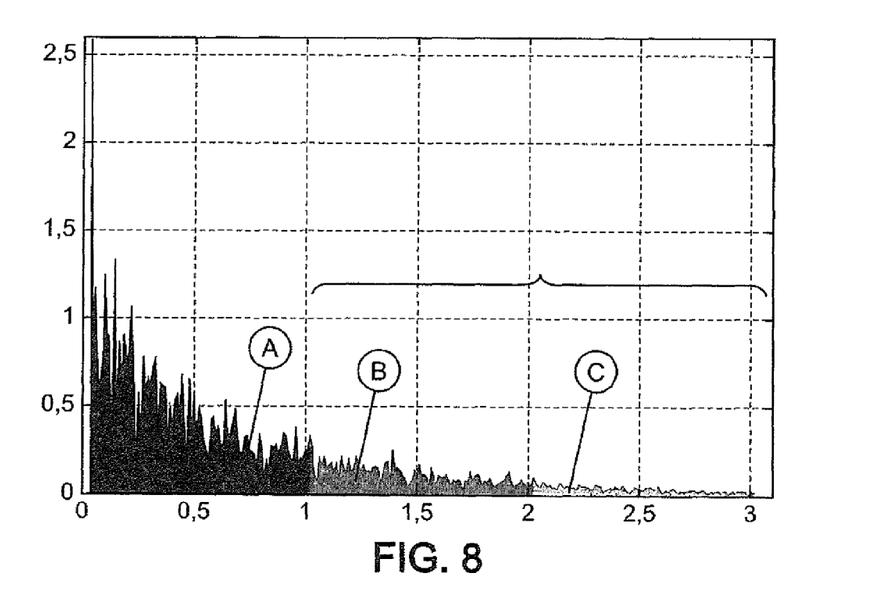

FIGS. 7 and 8 illustrate an effect of the method that makes the SRC system shift invariant, which is the spectral un-aliasing. FIG. 7 shows the spectrum of an output signal of a conventional SRC system (the ordinate show the gain in dB, and the abscissa show the normalized pulsation). All the components of the spectrum are in the frequency band between 0 and 1. The spectrum comprises the main spectrum of the output signal A, and also aliased components B and C. FIG. 8 shows the spectrum of an output signal of the same SRC system made shift-invariant according to an embodiment. In his spectrum, only the main spectrum A is in the frequency band between 0 and 1. The aliased components B and C have been rejected out of the band.

Appendix

The object of this appendix is to evaluate the polyphase expression of a re-sampled signal.

Consider the input sequence which z-transform is b(z). Consider a fractional resampler×R/P the canonical representation of which is based on the low pass filter H(z). Let evaluate the z-transform s(z) of the re-sampled signal. In order to do so, consider first the z-transform σ(z) resulting from the R-expansion:

$$\sigma(z) = H(z) \cdot b(z^R)$$

The z-transform s(z) is obtained from σ(z) after a P-fold decimation; when we consider a 0 offset for this decimation, we obtain (with $\omega_p$ being a root of $X^P - 1$):

$$s(z^P) = \frac{1}{P} \sum_{m=0}^{P-1} \sigma(\omega_P^m z)$$

Altogether, we obtain:

$$s(z^P) = \frac{1}{P} \sum_{m=0}^{P-1} H(\omega_P^m z) \cdot b(\omega_P^{Rm} z^R)$$

The Characterization of an SRC System

In the previous examples, the transfer function for a resampler with a fractional ratio R/P was established in Eq. (5), for instance, evaluated in the oversampled normalized domain:

$$S(e^{j\frac{\pi v}{M}})$$

Note that $$\forall v \in [0, M),$$
$$S(e^{j\frac{\pi v}{M}}) = H(e^{j\frac{\pi v}{R}}) \times B(e^{j\frac{\pi v}{M}})$$

includes M/R duplications of $$H(e^{j\frac{\pi v}{R}}).$$

One possible way to recover $$H(e^{j\frac{\pi v}{R}})$$

from $$S(e^{j\frac{\pi v}{M}})$$

is therefore to reweight appropriately each duplicate:

$$\forall v \in [0, R), \quad (6)$$

$$H(e^{j\frac{\pi v}{R}}) = \sum_{l=0}^{\lceil \frac{R}{2} \rceil - 1} W_l^+(v) \frac{S(e^{j\frac{\pi(v+2lR)}{M}})}{B(e^{j\frac{\pi(v+2lR)}{M}})}$$

with, for instance the following weighting $W_l^+(v)$:

$$\forall v \in [0, R),$$

$$W_l^+(v) = \frac{|B(e^{j\frac{\pi(v+2lR)}{M}})|^2}{\sum_{r=0}^{\lceil \frac{R}{2} \rceil - 1} |B(e^{j\frac{\pi(v+2rR)}{M}})|^2}$$

It is even possible to take into account spectrum duplicates corresponding to negative frequencies:

$$H(e^{j\frac{\pi v}{R}}) = \sum_{l=0}^{\lceil \frac{R}{2} \rceil - 1} W_l^+(v) \frac{S(e^{j\frac{\pi(v+2lR)}{M}})}{B(e^{j\frac{\pi(v+2lR)}{M}})} + \sum_{l=1}^{\lfloor \frac{R}{2} \rfloor} W_l^-(v) \frac{\overline{S}(e^{j\frac{\pi(v-2lR)}{M}})}{\overline{B}(e^{j\frac{\pi(v-2lR)}{M}})}$$

with, in that case, the weights updated accordingly:

$$W_l^\pm(v) = \frac{|B(e^{j\frac{\pi(v\pm 2lR)}{M}})|^2}{\sum_{r=0}^{\lceil \frac{R}{2} \rceil - 1} |B(e^{j\frac{\pi(v+2rR)}{M}})|^2 + \sum_{r=1}^{\lfloor \frac{R}{2} \rfloor} |B(e^{j\frac{\pi(v-2rR)}{M}})|^2}$$

$b_{k/M}$ was previously presented as an approximation from a shifted unit impulse. However, this assumption is not needed in order to obtain Eq. (3). Indeed, for the same reasons than for regular filter transfer function characterization, a pseudo-noise excitation vector can be preferred to the impulse-response method, in our case, a specifically designed set of test vectors can also be preferred to a band-limit impulse response. The recover formula in Eq. (6) indicates that it is even not necessary for $$B(e^{j\frac{\pi v}{M}})$$

to be exactly non-zero since the duplications for $$H(e^{j\frac{\pi v}{R}})$$

produce redundancy and therefore a tolerance to zeros.

An additional possibility for recovering H(z) and to increase tolerance to zeros (and incidentally tolerance to floating-point rounding errors) is to consider multiple answers $S^{(u)}(z)$ to different sets of test vectors $B^{(u)}(z)$ instead of S(z) alone. In such case, the recovery formula Eq. (6) is generalized by:

$$H(e^{j\frac{\pi v}{R}}) = \sum_{u} \sum_{l=0}^{\lceil \frac{R}{2} \rceil - 1} W_l^{(u)}(v) \frac{S^{(u)}(e^{j\frac{\pi(v+2lR)}{M}})}{B^{(u)}(e^{j\frac{\pi(v+2lR)}{M}})} \quad (7)$$

with, once again, the generalized weighting $W_l^{(u)}(v)$:

$$\forall v \in [0, R),$$

$$W_l^{(u)}(v) = \frac{|B^{(u)}(e^{j\frac{\pi(v+2lR)}{M}})|^2}{\sum_u \sum_{r=0}^{\lceil\frac{R}{2}\rceil-1} |B^{(v)}(e^{j\frac{\pi(v+2rR)}{M}})|^2}$$

Said differently, it is enough for the aliased transfer functions $$(B^{(u)}(e^{j\frac{\pi(v\pm 2lR)}{M}}))_{u,l}$$

to cover the range [0,R) in the oversampled normalized spectral domain in order to recover safely the transfer function $$H(e^{j\frac{\pi v}{R}}).$$

Figure 5:
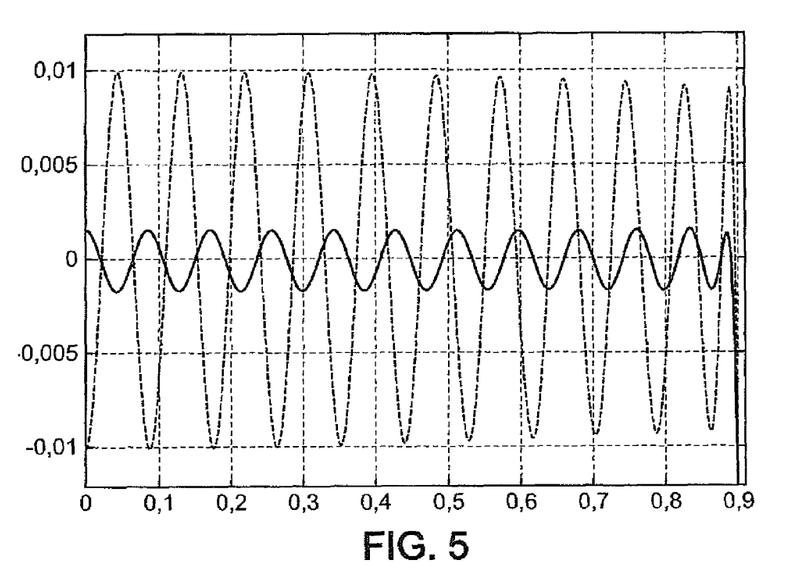
FIGS. 5 and 6 illustrate the evaluation of the transfer function of an SRC system according to embodiments of the invention.
Figure 6:
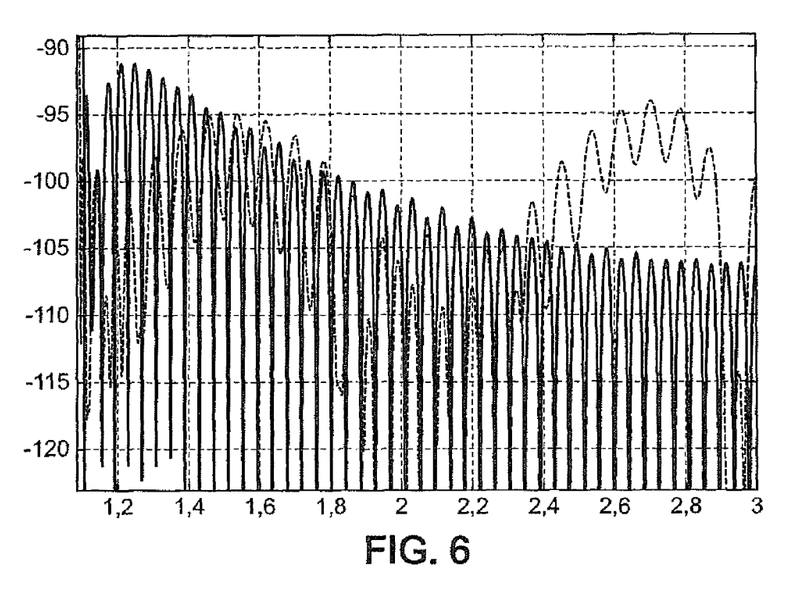

FIGS. 5 and 6 illustrate how the transfer function of two different upsampler systems (plain and dotted curves) for rate ×3 can be evaluated for respectively the in-band (FIG. 5) and the out-of-band (FIG. 6) domain. One can see that in the in-band domain, the systems behave linearly. The spectral aliases have been pushed in the out-of-band. Those estimations were obtained with the help of complementary sets of test vectors, $B^{(1)}(z)$ and $B^{(2)}(z)$. The first set, $$b_{\frac{k}{M}}^{(1)}(z),$$

is obtained with a low-order low-pass filter. The second set of test vectors $$b_{\frac{k}{M}}^{(2)}(z)$$

is derived from $$b_{\frac{k}{M}}^{(1)}(z)$$

by a modulation at the Nyquist frequency (i.e. a multiplication by the sequence 1, −1, 1, −1, 1 . . . ).

Instead of recovering the transfer function $$H(e^{j\frac{\pi v}{R}}),$$

the multi-rate framework from FIG. 3 can be used in order to recover the impulse response $h_n$ instead. The impulse response $h_n$ is directly available as $y_n$ if an impulse is fed as $x_n$ and Q is set to 1. When $x_n$ is set to an impulse $\delta_n$, only remains $$b_{\frac{mR}{R}} = z^m$$

for m in [0, P); any other contribution being pure zero:

$$H(z) = \sum_{m=0}^{P-1} z^{-mR} s_{\frac{mR}{P}}(z^P) \Rightarrow h_{nP+mR} = s_{\frac{mR}{P}}(n)$$

In the impulse method, the amount of processed vector needed is reduced: P processed vectors for the impulse method instead of at least PQR for other methods such as the transfer function method. However, it is possible that the redundancies aspects in the transfer function method guaranty a better robustness against quantization noises.

Those simple examples demonstrate the different possibilities available for estimating an upsampler transfer function and to reveal the upsampler design characteristics for both in-band and out-of-band spectral domains.

Harmonic Distortion

The Total Harmonic Distortion (THD) method is a power comparison between the original signal (sine wave) and the signal obtained by extracting the harmonic partials (comb filter) generated by the system on the original sine wave.

The Total Distortion (THD+Noise) method is a power comparison between the original signal (sine wave) and the signal obtained by removing the sine wave component from the distorted tone.

The test input signal b is a sine wave which period in the oversampled domain is Mp samples.

Then, the above discussed method making the SRC system shift-invariant is performed in order to produce the output signal s.

The width of the support of s is denoted lgt.

The complex vector $S_k$ of size lgt is Discrete Fourier Transform of the output signal s.

The element indexed by $$k = k_0 = \frac{lgt}{2Rp}$$

in the vector $S_k$ corresponds to the source sine wave. The harmonic distortion of the source sine can be found in the vector $S_k$ for every indexes multiple of k0, i.e. for k=jk0, with j from 0 to pR−1.

Since the analysed system is made shift-invariant by the present method, the only source of harmonic non-linearities originates from rounding error due to the floating-point or fixed-point arithmetic used internally by the device.

Exponential Sine-Sweep

The Sine Sweep method consists in the generation of a sine sweep as the input signal and the examination in a time-frequency domain (e.g. a spectrogram) of the SRC processing. This examination reveals separable alias trajectories for each aliased components; it reveals also the characteristics from the in-band linear response which is roughly available as the time envelop from the time response.

The Exponential Sine-Sweep consists in the generating an exponential sine-sweep in the oversampled domain and feeding it to the LSI system. The output reveals separately the linear characteristics, the stop-band characteristics and the rounding-error characteristics.

The Exponential Sine Sweep (ESS) method, aims at characterizing simultaneously the linear and non-linear behaviour of a device (e.g. a transducer) provided that this device follows a model restricted to a certain subclass of Volterra Kernels.

When the ESS test vector is fed into a non-linear device, each distorted harmonic component appears as an anti-causal echo. Deconvolution separates each echo and allows objective measurement.

The sine wave used in the Harmonic Distortion method is replaced by an Exponential Sine-Sweep. Then, the Exponential Sine-Sweep (ESS) method is applied in the oversampled domain in order to characterize the shift-invariant system.

The ESS method applied to the SRC system enables to access to the linear characteristics of the SRC (i.e. the in-band and out-of-band characteristics from the core low-pass filter H) as well as the harmonic distortion characteristics of the algorithms (originating from rounding errors in internal arithmetics).

The Silence Sweep method allows the measure of the total distortion instead of the harmonic distortion. The idea relies on replacing the original sine sweep by a sine sweep subtracted from a pseudo-noise.

Embodiments of the present invention can be embedded in a computer program product, which comprises all the features enabling the implementation of the methods described herein, and which—when loaded in an information processing system—is able to carry out these methods. Computer program means or computer program in the present context mean any expression, in any language, code or notation, of a set of instructions intended to cause a system having an information processing capability to perform a particular function either directly or after a conversion to another language. Such a computer program can be designed based on the flowchart of FIGS. 2a, 2b, 2c, FIG. 3, and the present description. The computer program can be stored on a computer or machine readable medium allowing data, instructions, messages or message packets, and other machine readable information to be read from the medium. The computer or machine readable medium may include non-volatile memory, such as ROM, Flash memory, Disk drive memory, CD-ROM, and other permanent storage. Additionally, a computer or machine readable medium may include, for example, volatile storage such as RAM, buffers, cache memory, and network circuits. Furthermore, the computer or machine readable medium may comprise computer or machine readable information in a transitory state medium such as a network link and/or a network interface, including a wired network or a wireless network, that allow a device to read such computer or machine readable information.

Embodiments of the invention can be embedded in hardware circuits. For example, the circuits are implemented by the preparation of ASICs, FPGAs, microcontrollers or discrete logic elements by interconnecting an appropriate network of conventional component circuits. The circuit may also comprise memory elements such as ROMs, RAMs, EPROMs, EEPROMs, Flash memory, magnetic or optical cards, or any type of media suitable for storing electronic information.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

A person skilled in the art will readily appreciate that various parameters disclosed in the description may be modified and that various embodiments disclosed may be combined without departing from the scope of the invention.

The invention claimed is:

1. A method of converting the sampling rate of an input signal with input/output shift-invariance using a Linear Periodically Time Varying (LPTV) system, the method comprising:

generating a set of polyphase components of the input signal wherein the LPTV system is a digital Sampling Rate Conversion (SRC) system having a fractional ratio $$\frac{R}{P},$$

with R and P being co-primes:
selecting three integer numbers Q, M and q that satisfy the following equations:

M=RQ;

q=PQ; and

MP=qR;

feeding the generated set of polyphase components to the SRC system; and
generating an output signal corresponding to the input signal with a converted sampling rate, by performing interleaving, shifting, and addition on signals output by the SRC system corresponding to the generated set of polyphase components processed by the SRC system;
wherein the generation of each polyphase component of the set of polyphase components comprises:
time shifting the input signal a number of times between 0 and MP; and
M-fold decimating the time shifted input signals.

2. The method of claim 1, wherein each polyphase component of the set of polyphase components is fed to a respective instantiation of the SRC system.

3. The method of claim 1, wherein generating the output signal comprises:
q-fold expanding each signal output by the SRC system corresponding to the generated set of polyphase components processed by the SRC system; and
adding each expanded output signal to a time shifted sum of previously expanded output signals.

4. The method of claim 1, wherein generating the output signal comprises:
q-fold expanding each signal output by the SRC system corresponding to the generated set of polyphase components processed by the SRC system; and performing an overlapping add operation on the expanded output signals.

5. The method of claim 1, further comprising:
inputting the input signal, the input signal being one of the group consisting of: an impulse and a test sequence; and
characterizing the SRC system through the output signal.

6. The method of claim 1, further comprising:
inputting the input signal, the input signal being one of the group consisting of: a sine-sweep signal, a sine signal, multiple sine signals, a multi-sine signal, multiple multi-sine signals, a maximum length sequence, or an all pass filtered impulse signal; and
characterizing the LPTV system through the output signal.

7. The method of claim 6, wherein the characterization is performed by harmonic distortion or total harmonic distortion.

8. The method of claim 6, wherein the characterization comprises a characterization of non-linearities of the LPTV system.

9. A computer program product stored in a computer readable medium, the computer program product comprising program instructions for converting the sampling rate of an input signal with input/output shift-invariance using a Linear Periodically Time Varying (LPTV) system, the computer program product comprising computer program code which, when run by a data-processing unit, configures the data-processing unit to:
generate a set of polyphase components of the input signal wherein the LPTV system is a digital Sampling Rate Conversion (SRC) system having a fractional ratio $$\frac{R}{P},$$

with R and P being co-primes;
select three integer numbers Q, M and q that satisfy the following equations:

$M=RQ;$ $q=PQ;$ and $MP=qR;$ feed the generated set of polyphase components to the SRC system; and
generate an output signal corresponding to the input signal with a converted sampling rate, by performing interleaving, shifting, and addition on signals output by the SRC system corresponding to the generated set of polyphase components processed by the SRC system;
wherein the generation of each polyphase component of the set of polyphase components comprises:
time shifting the input signal a number of times between 0 and MP; and
M-fold decimating the time shifted input signals.

10. A system for converting the sampling rate of an input signal with input/output shift-invariance comprising:
a Linear Periodically Time Varying (LPTV) system being a Sampling Rate Conversion (SRC) system having a fractional ratio $$\frac{R}{P},$$

with R and P being co-primes;
a first input port configured to receive the input signal;
a first output port configured to output polyphase components of the input signal to the SRC system;
a second input port configured to receive signals outputted by the SRC system corresponding to the polyphase components processed by the SRC system; and
a processing unit configured to generate the polyphase components and to select three integer numbers Q, M and q that satisfy the following equations:

$M=RQ;$ $q=PQ;$ and $MP=qR;$ wherein the processing unit comprises:
a time shifting unit configured to time shift the input signal a number of times between 0 and MP; and
an M-fold decimator configured to decimate the time shifted input signals;
the processing unit being further configured to perform interleaving, shifting and addition on the signals outputted by the SRC system for generating an output signal; and
the system further comprising a second output port configured to output the generated output signal.

11. The system of claim 10, wherein the processing unit is further configured to instantiate the SRC system for each polyphase component outputted to the SRC system.

12. The system of claim 11, wherein the processing unit further comprises:
a q-fold expander configured to expand each signal output by the sampling rate conversion system corresponding to the generated polyphase components processed by the sampling rate conversion system; and
an adder and a time shifting unit configured to add each expanded output signal to a time shifted sum of previously expanded output signals.

13. The system of claim 10, further comprising:
a characterization unit configured to characterize the SRC system through the output signal.

* * * * *